United States Patent
Van Zyl

(10) Patent No.: US 9,773,644 B2
(45) Date of Patent: *Sep. 26, 2017

(54) POWER GENERATOR WITH FREQUENCY TUNING FOR USE WITH PLASMA LOADS

(71) Applicant: Advanced Energy Industries, Inc., Fort Collins, CO (US)

(72) Inventor: Gideon Van Zyl, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/076,461

(22) Filed: Mar. 21, 2016

(65) Prior Publication Data

US 2016/0276138 A1    Sep. 22, 2016

Related U.S. Application Data

(63) Continuation of application No. 14/094,520, filed on Dec. 2, 2013, now Pat. No. 9,294,100.
(Continued)

(51) Int. Cl.
 *H04B 1/04* (2006.01)
 *H01J 37/32* (2006.01)
 (Continued)

(52) U.S. Cl.
 CPC .......... *H01J 37/32155* (2013.01); *G04F 5/14* (2013.01); *H01J 37/32082* (2013.01);
 (Continued)

(58) Field of Classification Search
 CPC ................................................ H04J 37/32155
 (Continued)

(56) References Cited

U.S. PATENT DOCUMENTS 6,020,794 A    2/2000 Wilbur
6,791,274 B1   9/2004 Hauer et al.
(Continued)

FOREIGN PATENT DOCUMENTS

CN    1233147 A    10/1999
CN    1656593 A    8/2005
(Continued)

OTHER PUBLICATIONS

Peeters, Mark, "European Search Report re Application No. 13861483.9", Jul. 29, 2016, p. 6, Published in: EP.
(Continued)

*Primary Examiner* — Sanh Phu
(74) *Attorney, Agent, or Firm* — Neugeboren O'Dowd PC

(57) ABSTRACT

A generator and method for tuning the generator are disclosed. The method includes setting the frequency of power applied by the generator to a current best frequency and sensing a characteristic of the power applied by the generator. A current best error based upon the characteristic of the power is determined, and the frequency of the power at the current best frequency is maintained for a main-time-period. The frequency of the power is then changed to a probe frequency and maintained at the probe frequency for a probe-time-period, which is less than the main-time-period. The current best frequency is set to the probe frequency if the error at the probe frequency is less than the error at the current best frequency.

17 Claims, 9 Drawing Sheets

Related U.S. Application Data

(60) Provisional application No. 61/733,397, filed on Dec. 4, 2012.

(51) Int. Cl.

| | | |
|---|---|---|
| *H03L 1/00* | (2006.01) | |
| *G04F 5/14* | (2006.01) | |
| *H03L 7/26* | (2006.01) | |
| *H03F 1/56* | (2006.01) | |
| *H03F 3/189* | (2006.01) | |
| *H03F 3/24* | (2006.01) | |
| *H05H 1/46* | (2006.01) | |

(52) U.S. Cl.
CPC .... *H01J 37/3299* (2013.01); *H01J 37/32183* (2013.01); *H01J 37/32917* (2013.01); *H03F 1/56* (2013.01); *H03F 3/189* (2013.01); *H03F 3/24* (2013.01); *H03L 1/00* (2013.01); *H03L 7/26* (2013.01); *H03F 2200/451* (2013.01); *H05H 2001/4682* (2013.01)

(58) Field of Classification Search
USPC .......................................................... 455/120
See application file for complete search history.

(56) References Cited

U.S. PATENT DOCUMENTS

| | | | | |
|---|---|---|---|---|
| 7,839,223 | B2 * | 11/2010 | Van Zyl | H01J 37/32082 315/111.21 |
| RE42,917 | E * | 11/2011 | Hauer | H01J 37/32082 118/723 MW |
| 9,294,100 | B2 * | 3/2016 | Van Zyl | H01J 37/32155 |
| 2003/0215373 | A1 | 11/2003 | Reyzelman et al. | |
| 2006/0220656 | A1 | 10/2006 | Tanaka et al. | |
| 2007/0139122 | A1 | 6/2007 | Nagarkatti et al. | |
| 2009/0237170 | A1 | 9/2009 | Van Zyl et al. | |
| 2011/0148303 | A1 * | 6/2011 | Van Zyl | H03F 1/56 315/111.21 |
| 2012/0152914 | A1 * | 6/2012 | Matsuura | G03F 7/427 219/121.42 |

FOREIGN PATENT DOCUMENTS

| | | |
|---|---|---|
| CN | 101297480 A | 10/2008 |
| JP | 2006286254 A | 10/2006 |
| JP | 2011515823 A | 5/2011 |
| NO | 2011087762 A1 | 7/2011 |
| TW | 418593 B | 1/2001 |

OTHER PUBLICATIONS

TIPO, "Taiwan Office Action re Application No. 102144318", Dec. 29, 2015, p. 13 Published in: TW.

Phu, Sanh D., "Office Action re U.S. Appl. No. 14/094,520", May 12, 2015, p. 27 Published in: US.

O'Dowd, Sean R., "Response to Office Action re U.S. Appl. No. 14/094,520", Sep. 14, 2015, p. 7, Published in: US.

Nickitas-Etienne, "International Preliminary Report on Patentability re Application No. PCT/US2013/072748", Jun. 18, 2015, p. 6, Published in: CH.

Mitrovic, Bayer, "International Search Report and Written Opinion re Application No. PCT/US2013/072748", Feb. 25, 2014, p. 9, Published in: AU.

SIPO, "Chinese Office Action Re Application No. 201380069333.3", Nov. 3, 2016, p. 18, Published in: CN.

Fujimoto, Kayoko, "Japanese Office Action Re Application No. 2015546544", Mar. 21, 2017, p. 4, Published in: JP.

* cited by examiner

POWER GENERATOR WITH FREQUENCY TUNING FOR USE WITH PLASMA LOADS

CLAIM OF PRIORITY UNDER 35 U.S.C. §120

The present application for patent is a Continuation of patent application Ser. No. 14/094,520 entitled "Frequency Tuning System and Method for Finding a Global Optimum" filed Dec. 2, 2013, pending, and assigned to the assignee hereof and hereby expressly incorporated by reference herein.

FIELD OF THE INVENTION

This invention relates generally to power supplies for plasma processing applications, and more particularly to systems and methods for frequency tuning power supplies.

BACKGROUND OF THE INVENTION

Frequency tuning in RF generators is often used to reduce reflected power. A typical set-up is shown in FIG. 1. Typically, but not always, some type of matching network is used to match the load to the generator. By correct design of the matching network (either internal to the generator or external as shown in FIG. 1), it is possible to transform the impedance of the load to a value close to the desired load impedance of the generator (either at the RF output connector, typically 50Ω, or at the active devices internal to the generator, typically some low complex impedance such as 8+j3Ω) at some frequency in the range of frequencies that the generator can produce. The measure of how close the load impedance is to the desired impedance can take many forms, but typically it is expressed as a reflection coefficient $$\rho = \frac{Z - Z_0}{Z + Z_0^*}$$

where $\rho$ is the reflection coefficient of the impedance Z with respect to the desired impedance $Z_0$ and x* means the complex conjugate of x. The magnitude of the reflection coefficient, $|\rho|$, is a very convenient way of expressing how close the impedance Z is to the desired impedance $Z_0$. Both Z and $Z_0$ are in general complex numbers.

Frequency tuning algorithms and methods try to find the optimal frequency of operation. Optimality is often defined as the frequency where the magnitude of the reflection coefficient with respect to the desired impedance is the smallest. Other measures may be minimum reflected power, maximum delivered power, stable operation etc. On a time-invariant linear load, many algorithms will work well, but on time-varying and/or nonlinear loads special techniques are required to ensure reliable operation of the tuning algorithm.

Assuming that the optimum frequency of operation is the frequency at which the load reflection coefficient magnitude is at its minimum, it is noted that the relationship between the controlled variable (frequency) and the error is frequently not monotonic and furthermore the optimum point of operation is generally at a point where the gain ([change in error]/[change in frequency]) is zero. To add to the challenges it is also possible that local minima may exist in which any control algorithm can get trapped. FIG. 2A shows a plot of load reflection coefficient on a load reflection coefficient chart (Smith chart) at the top, and FIG. 2B shows the magnitude of the load reflection coefficient used as the error as a function of frequency. This plot demonstrates the problems described above with a local minimum at $f_o$ separated from the global optimum at $f_b$ by a region of high load reflection coefficient around $f_a$ and (as is invariably the case) zero slope of the error function at the global optimum frequency $f_b$.

Two common problems on plasma loads are the nonlinear nature of the load (the load impedance is a function of power level) and that the load impedance changes over time (e.g., because of changing chemistry, pressure, temperature etc. over time). Another problem that is unique to plasma (or plasma-like) loads is that the plasma can extinguish if the delivered power to the plasma falls below some value for a long enough time. The frequency-tuning algorithm can therefore not dwell at a frequency where enough power cannot be delivered for very long or the plasma may extinguish.

SUMMARY

Illustrative embodiments of the present disclosure that are shown in the drawings are summarized below. These and other embodiments are more fully described in the Detailed Description section. It is to be understood, however, that there is no intention to limit the disclosure to the forms described in this Summary or in the Detailed Description. One skilled in the art can recognize that there are numerous modifications, equivalents, and alternative constructions that fall within the spirit and scope of the disclosure as expressed in the claims.

According to one aspect, a method for tuning a generator is provided. The method includes setting the frequency of power applied by the generator to a current best frequency and sensing a characteristic of the power applied by the generator. A current best error is then determined based upon the characteristic of the power, and the frequency of the power is maintained at the current best frequency for a main-time-period. The frequency of the power is changed to a probe frequency and maintained at the probe frequency for a probe-time-period, which is less than the main-time-period. The current best frequency is set to the probe frequency if the error at the probe frequency is less than the error at the current best frequency.

According to another aspect, a generator is provided. The generator may include a controllable signal generator to generate a frequency in response to a frequency control signal and a power amplifier to generate power at the generated frequency. An output line of the generator is coupled to the power amplifier, and a sensor is coupled to the power amplifier to provide an output signal indicative of an impedance presented to the power amplifier. A controller provides the frequency control signal to the controllable signal generator in response to the output signal from the sensor, and the controller includes a processor and a non-transitory, tangible computer readable storage medium encoded with processor readable instructions for adjusting the frequency control signal.

DETAILED DESCRIPTION

The word "exemplary" is used herein to mean "serving as an example, instance, or illustration." Any embodiment described herein as "exemplary" is not necessarily to be construed as preferred or advantageous over other embodiments.

Figure 1:
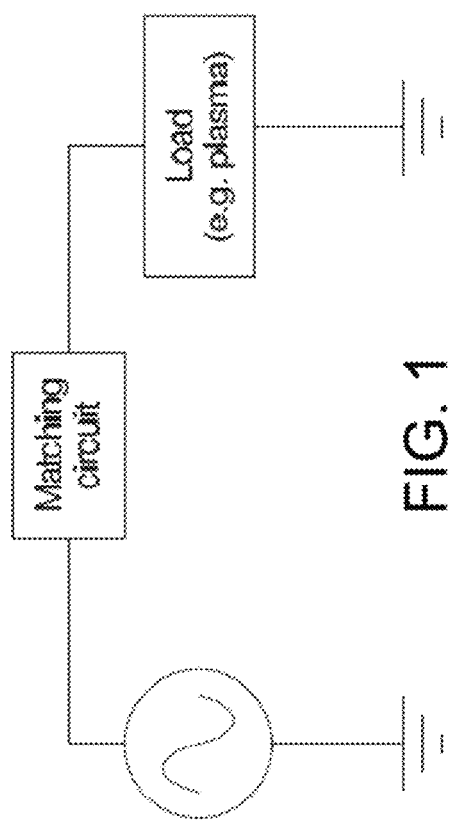
FIG. 1 is a system schematic showing generator delivering power to a load through a matching network.
Figure 2A:
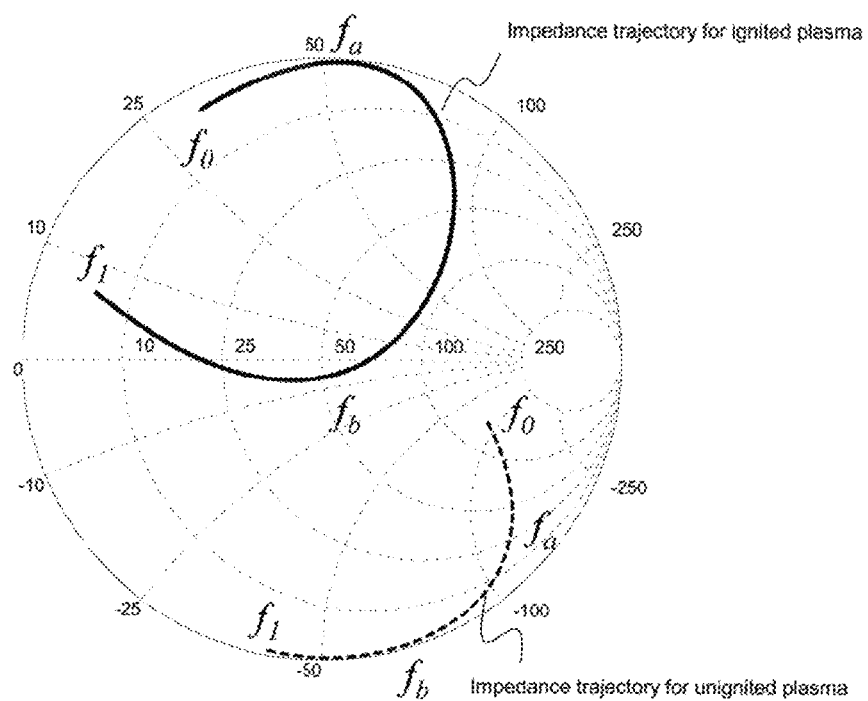
FIGS. 2A and 2B depict general behavior of load reflection coefficient as a function of frequency.
Figure 2B:
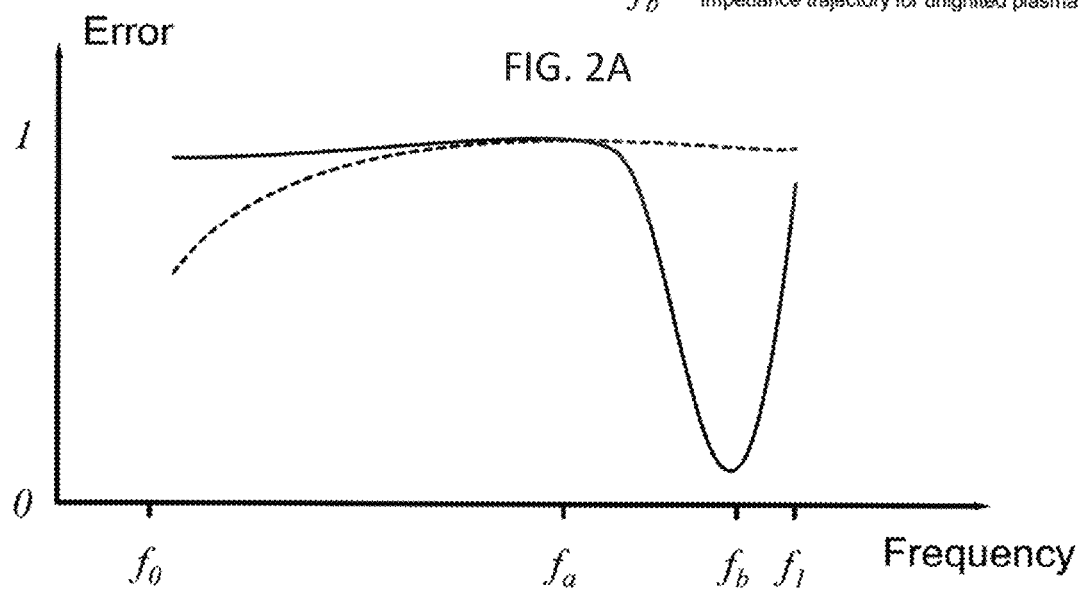

Embodiments of the current invention solve the problem of finding a global optimum to the tuning problem without extinguishing a plasma load. The problem can be understood by referring to FIGS. 2A and 2B. As is evident from FIGS. 2A and 2B, any algorithm that searches for a local minimum of the load reflection coefficient will move towards the minimum frequency, $f_0$, if the current frequency is between $f_0$ and the frequency where the load reflection coefficient is highest, $f_a$. This situation, where the current frequency will move towards a local minimum, which is not the desired operating frequency, is quite common. In plasma systems in particular, the plasma chamber without a lit (ignited) plasma has a very different behavior than the chamber with a lit plasma. If the frequency where the plasma can be ignited is between $f_0$ and $f_a$, then the initial frequency will be between $f_0$ and $f_a$. Once the plasma is lit, the problem becomes how to find the global best frequency, $f_b$, starting from a frequency between $f_0$ and $f_a$. Unlike other loads, simply sweeping the frequency from $f_0$ to $f_1$ until the globally optimum frequency, $f_b$, is found is not an option. The problem is that when the frequency is in the vicinity of $f_a$ almost no power can be delivered to the plasma and the plasma will very likely extinguish. If the plasma extinguishes, the sweep will then continue with an unlit plasma with completely different characteristics and the global optimum $f_b$ will not be found unless the plasma somehow reignites in the vicinity of $f_b$. Even if the plasma somehow reignites and the sweep is thus successful, the very act of allowing the plasma to extinguish during the sweep is unacceptable in most applications.

To understand the problem, note that in order not to extinguish the plasma, the time spent probing a frequency can typically be no longer than a few tens of microseconds. If the load reflection coefficient at the frequency being probed is high and more than a few tens of microseconds are spent at that frequency, the plasma can extinguish. At the same time, the time that it takes the power control system of the generator to adjust to the desired power level is typically on the order of a few hundreds of microseconds, so for all practical purposes the reflection coefficient of the load is measured at the same power control input to the power amplifier with the actual power determined by the load impedance.

In the prior art it is known that a table of frequencies and associated reflection coefficients is compiled by probing to find the best operating frequency. Compiling such a table (e.g., as described in U.S. Pat. No. 7,839,223, which is incorporated herein by reference) is difficult because each candidate frequency may have to be visited multiple times until the load reflection coefficient is measured at the desired power level. The reason why the load reflection coefficient must be measured at the correct power level is due to the nonlinear nature of the load and can be understood by referring to FIGS. 3A and 3B.

Figure 3A:
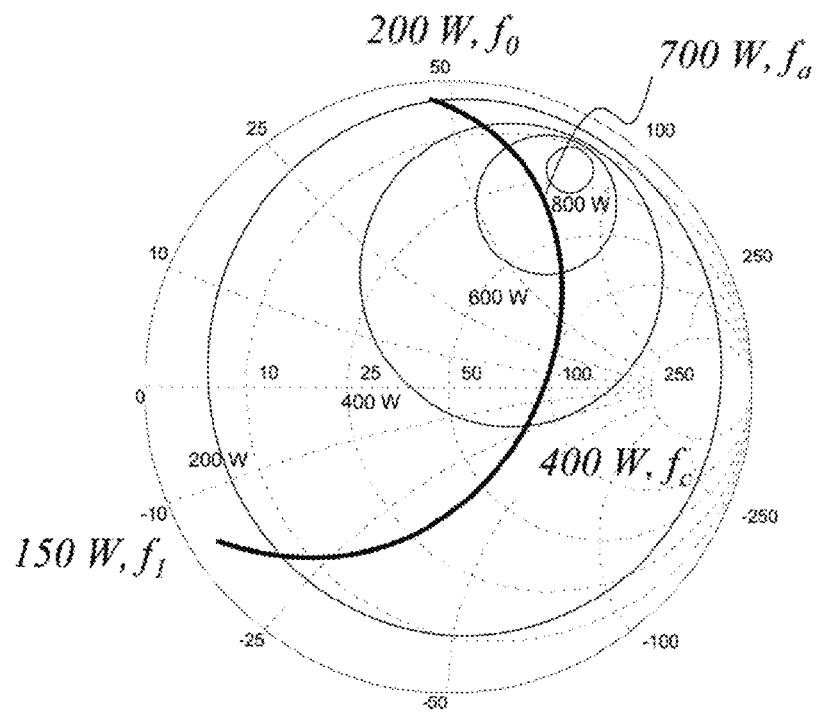
FIGS. 3A and 3B depict general behavior of load reflection coefficient as a function of frequency overlaid with open loop constant power contours of a typical RF generator.
Figure 3B:
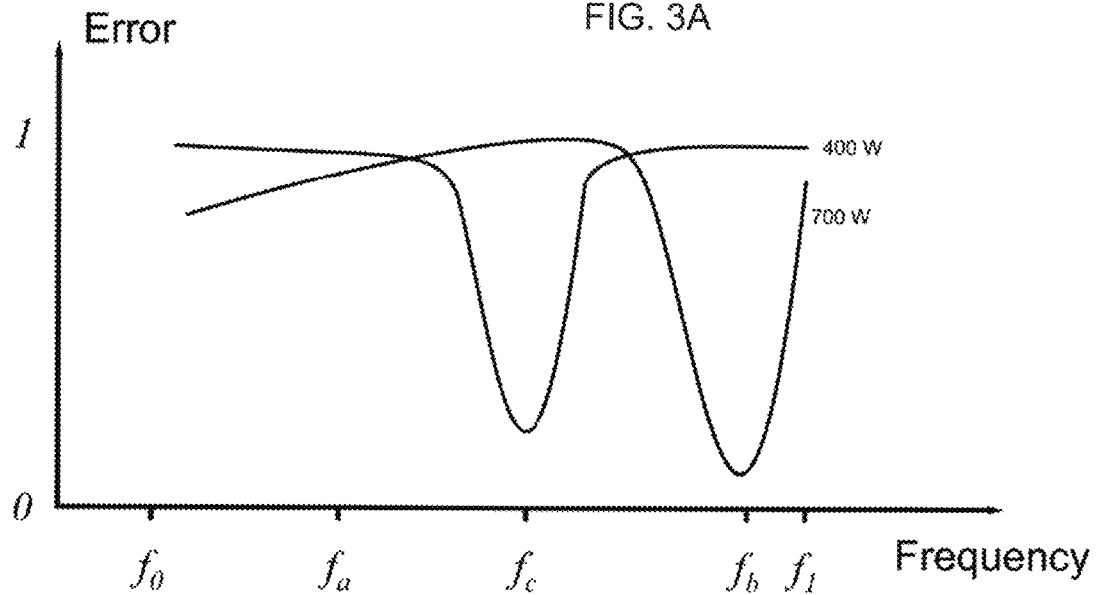

Referring to FIGS. 3A and 3B, if the generator is operating at 700 W at a frequency $f_a$ and probes the frequency space with the control to the power amplifier remaining at the current setting, the generator would find the apparent best reflection coefficient at a frequency $f_c$. However, as FIG. 3B shows, the actual best operating frequency is $f_b$. More damaging, if the generator were to change its operating frequency to $f_c$, then once the control system adjusts the power back to the desired setpoint (presumably 700 W or higher), the load reflection coefficient may be higher than at the original frequency, $f_a$. Moreover, for the generator to be operating at $f_a$ at 700 W generally means that either the setpoint for the generator is 700 W and the generator is capable of meeting the setpoint while applying power into the mismatched load impedance, or the setpoint for the generator is higher than 700 W but the generator can only deliver 700 W into the mismatched load. In either case, once the frequency is changed to $f_c$, it is likely that the generator will only be capable of delivering less power than what it could deliver at $f_a$. This can result in the plasma extinguishing if the frequency is changed to $f_c$. Thus it may be concluded that for a typical generator where, for a fixed control input to the power amplifier, maximum power is delivered to an impedance other than a matched load (typically 50Ω), the procedure described in U.S. Pat. No. 7,839,223 is advisable.

Figure 4A:
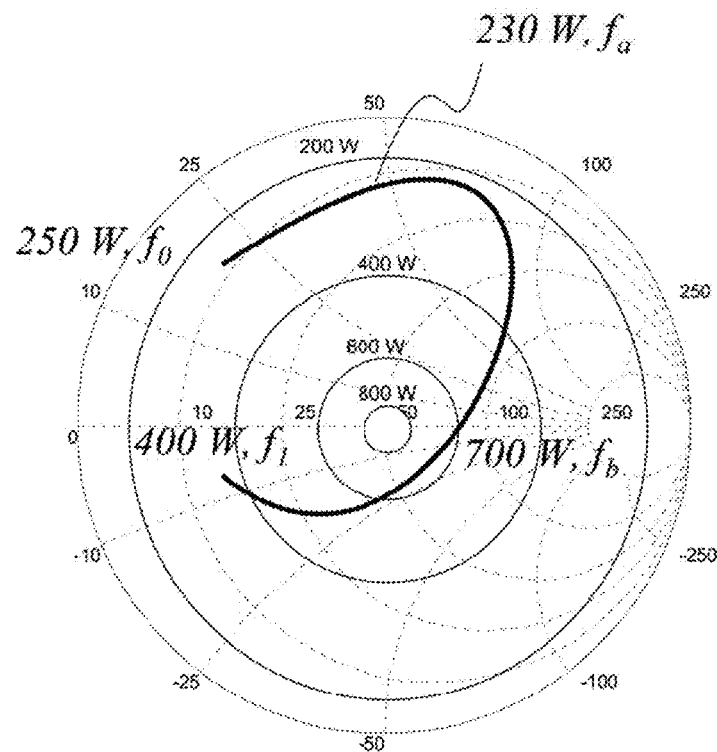
FIGS. 4A and 4B depict general behavior of load reflection coefficient as a function of frequency overlaid with open loop constant power contours of a RF generator with matched source impedance.
Figure 4B:
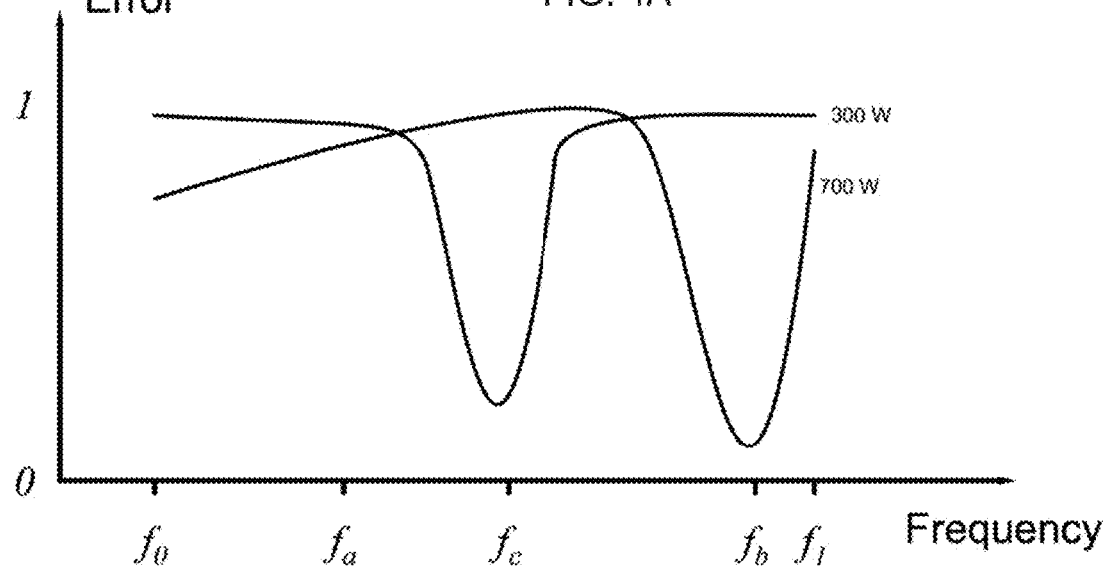

However, when the frequency-probing algorithm is combined with a power amplifier with a source impedance matched to the nominal load impedance (typically 50Ω) the algorithm can be simplified. To understand why, reference is made to FIG. 4. Assuming that the generator is operating at frequency $f_a$ at a power level of 300 W. If the probing algorithm finds a frequency, $f_{probe}$, at which the reflection coefficient is lower than at $f_a$, it also means that if the generator were to simply stay at this frequency, $f_{probe}$, the output power from the generator will be higher than the power at $f_a$ until the control loop of the generator adjusts the power back down to the setpoint. This is so because for a matched source impedance generator, output power increases if the control input to the power amplifier of the generator is held constant and the load reflection coefficient is decreased. Thus, in the case of a generator with a matched source impedance, there is no need to do multiple probes of the same frequency, each time adjusting the control input to the power amplifier. Instead of building a table, the generator can simply switch to operation at the probed frequency when the load reflection coefficient at the probed frequency is lower than the current frequency since the generator can deliver at least as much power at the new frequency as at the old.

Figure 5:
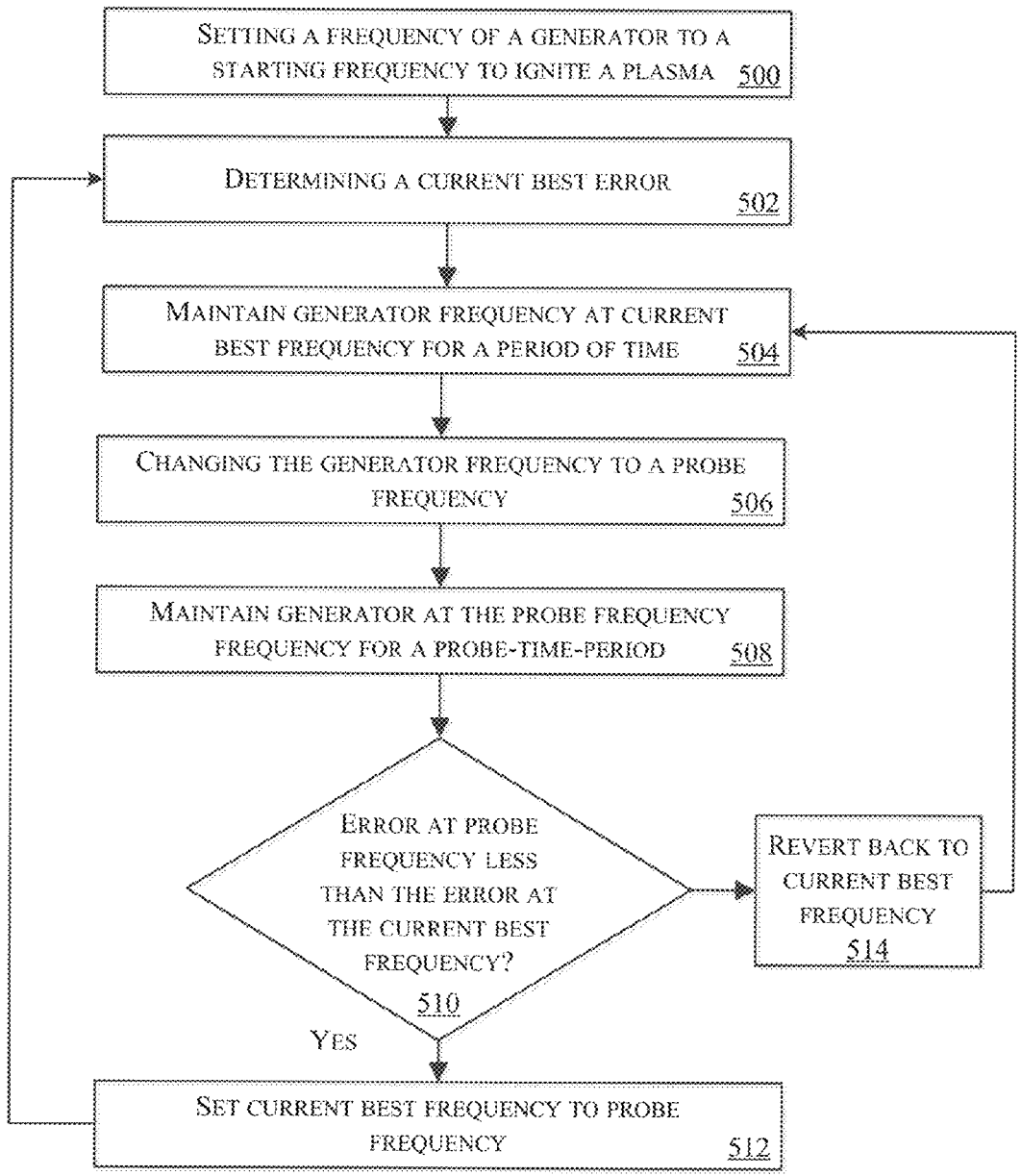
FIG. 5 is a flowchart depicting an exemplary method that may be traversed in connection with the embodiments disclosed herein.

To describe the algorithm the following variables are defined:

$f_{start}$: start frequency
$f_0$: minimum frequency
$f_1$: maximum frequency
$e_{main}$: error at current best frequency $f_{main}$: current best frequency $t_{main}$: time that the generator stays at current best frequency $t_{probe}$: time that the generator takes to probe a frequency $f_{probe}$: probe frequency Referring next to FIG. 5, it is a flowchart depicting a method for frequency tuning. While referring to FIG. 5, simultaneous reference is made to FIG. 6, which includes graphs depicting exemplary frequencies (and corresponding error values) that may be probed in connection with the method described with reference to FIG. 5. As depicted, the frequency of the generator is initially set to a start frequency, $f_{start}$, which is a frequency at which the plasma may be ignited (Block 500). An error is then determined. (Block 502), and the current best frequency (e.g., $f_{main1}$) is initially set to the start frequency ($f_{start}$, while the error at the current best frequency (e.g., $e_{main1}$) is set to the error determined at Block 502. In several embodiments, the error is a measure of how close the impedance presented to the generator is to a desired impedance (e.g., 50Ω). For example, the error may be calculated as a load reflection coe[cient magnitude, voltage standing wave ratio, reflected power, and a deviation from maximum delivered power. And in other embodiments, the error may be a value representative of an instability. It is contemplated that other values may be calculated or measured and utilized as an error value.

As depicted in FIG. 5, the generator then stays at the current best frequency (e.g., $f_{main1}$) for a main-time-period $t_{main}$ (Block 504) before switching to a probe frequency (e.g., $f_{probe1}$) (Block 506), and the generator remains at the probe frequency for a probe-time-period ($t_{probe}$) (Block 508). In some embodiments, the probe-time-period ($t_{probe}$) at Block 508 is less than 100 microseconds, and in other embodiments the probe time period ($t_{probe}$) is less than 10% of time that the generator stays at current best frequency ($t_{main}$) at Block 504.

Figure 6:
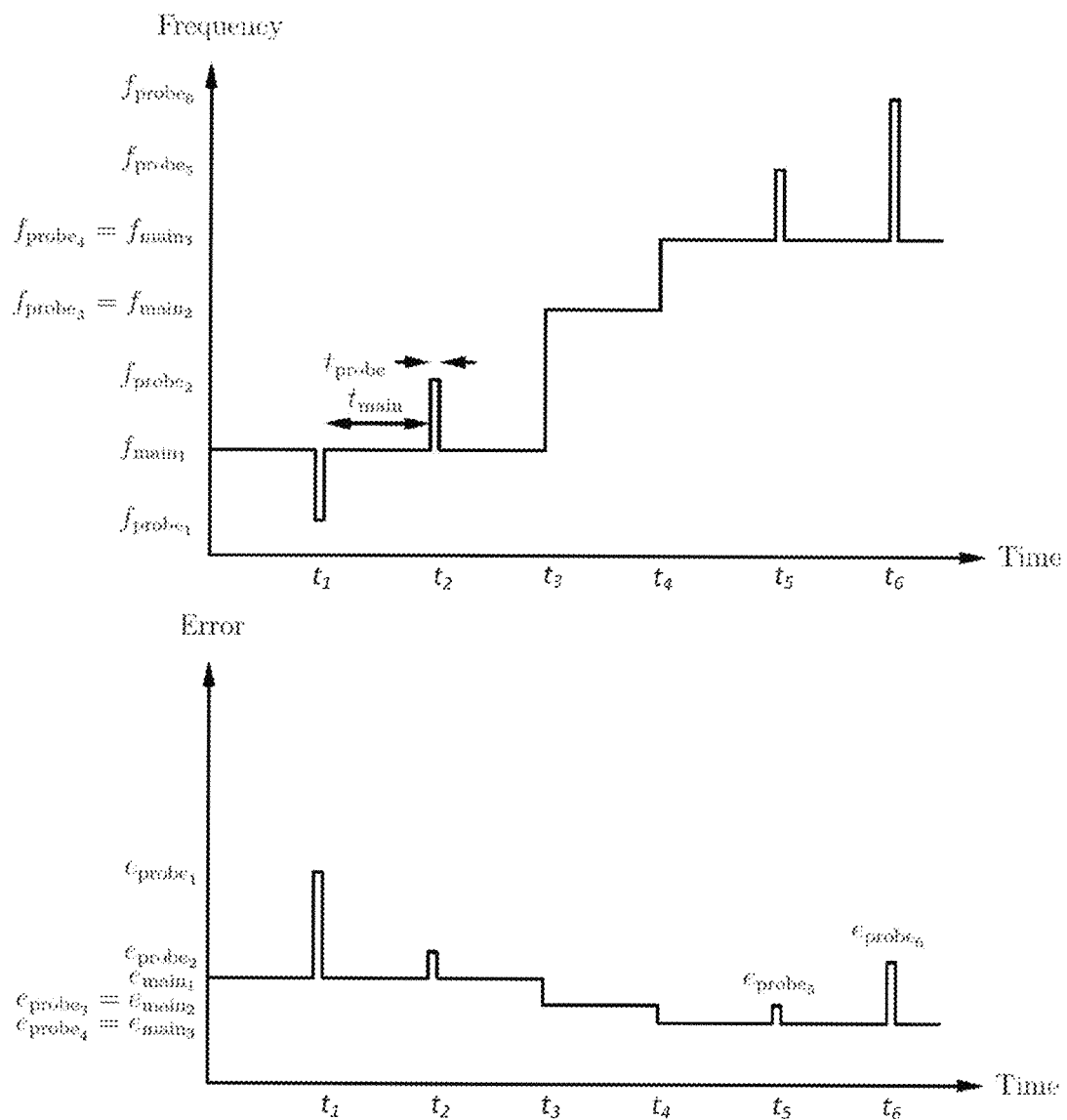
FIG. 6 includes graphs depicting exemplary frequencies that may be probed in connection with the method described with reference to FIG. 5 and corresponding error values.

If the probe error (e.g., $e_{probe1}$) at the probe frequency (e.g., $f_{probe1}$) is lower than the current best error (e.g., $e_{main1}$) (Block 510), the generator sets the current best frequency ($f_{main}$) to the probe frequency ($f_{probe}$) (Block 512). The current best error ($e_{main}$) is then determined at the new current best frequency ($f_{main}$) (Block 502) and the process is then repeated. As depicted, if the probe error (e.g., $e_{probe1}$) at the probe frequency (e.g., $f_{probe1}$) is not less than the current best error (e.g., $e_{main1}$) (Block 510), the generator frequency is set again to the current best frequency (e.g., $f_{main1}$) (Block 514), and the process is then repeated. FIG. 6 depicts exemplary behavior in which two probe frequencies ($f_{probe1}$ and $f_{probe2}$) are attempted (at times $t_1$ and $t_2$) before the probe error ($e_{probe3}$ at time $t_3$) is lower than the current best error, and then the error is reduced again at time $t_4$ at a new probe frequency $f_{probe4}$ that becomes and remains the current best frequency through two subsequent frequency probes ($f_{probe5}$ and $f_{probe6}$) that result in corresponding errors ($e_{probe5}$ and $e_{probe6}$) that are greater than the error ($e_{probe4}$) at the current best frequency $f_{probe4}$.

The choice of probe frequencies depends on the application, but to ensure that the entire frequency range is evaluated, an initial sweep should cover the entire frequency range of the generator in frequency steps small enough to ensure that minima in the error are not missed by jumping over areas of minimum error. After an initial sweep a smaller range around $f_{main}$ can be probed to refine the tuning. Refining of the range can be repeated until the best operating frequency is determined with su[cient accuracy. [

The tuning algorithm may be augmented by conditions for starting and stopping the tuning algorithm. For example, a lower and upper target for the error as well as a time to get to the lower target is typically set. The tuning algorithm will then attempt to get to the lower target in the allotted time. If it reaches the lower target the algorithm stops, and if the allotted time is exceeded, the algorithm stops if the error is less than the upper target. Once the algorithm is stopped, it is generally re-started when the upper target is exceeded. If the algorithm fails to reach the upper or lower targets, errors and warnings may be issued to the system controller.

Figure 7:
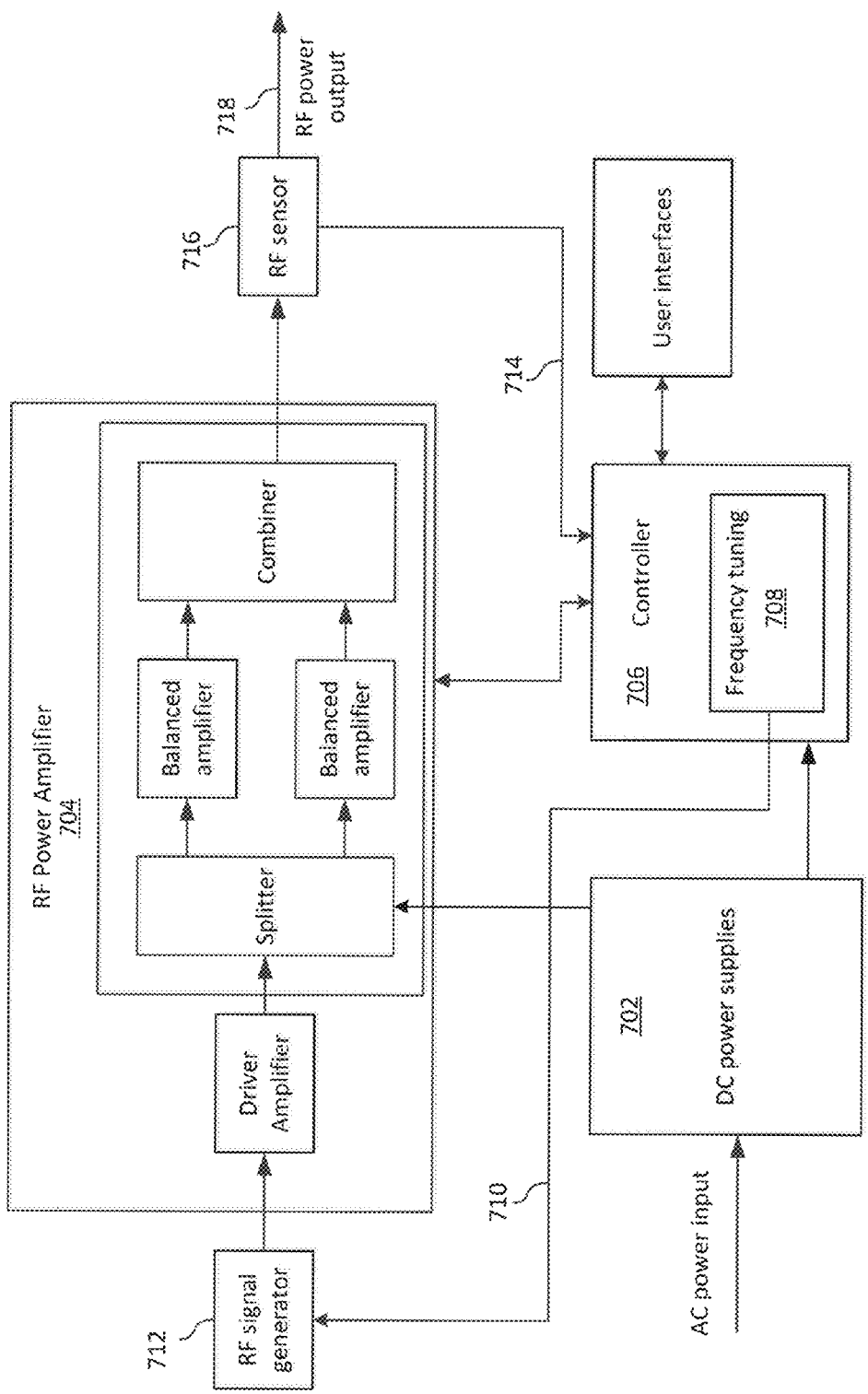
FIG. 7 is a diagram depicting an embodiment of a generator.

Referring next to FIG. 7, it is a block diagram depicting components of an exemplary embodiment of a generator. As shown, the generator includes one or more DC power supplies 702 that receive AC power and produce DC power to power a radio frequency (RF) power amplifier 704 and a controller 706. The controller 706 in this embodiment includes a frequency tuning component 708 that provides, responsive to an output signal 714 from a sensor 716 that is indicative of an impedance presented to the power amplifier 704, a frequency control signal 710 to signal generator 712. In response, the signal generator 712 generates a particular frequency (e.g., the current best frequency ($f_{main}$) and probe frequencies ($f_{probe}$)) corresponding to the frequency control signal 710, and the power amplifier 704 amplifies the output of the signal generator 712 to generate output power 718 at the particular frequency.

Figure 8:
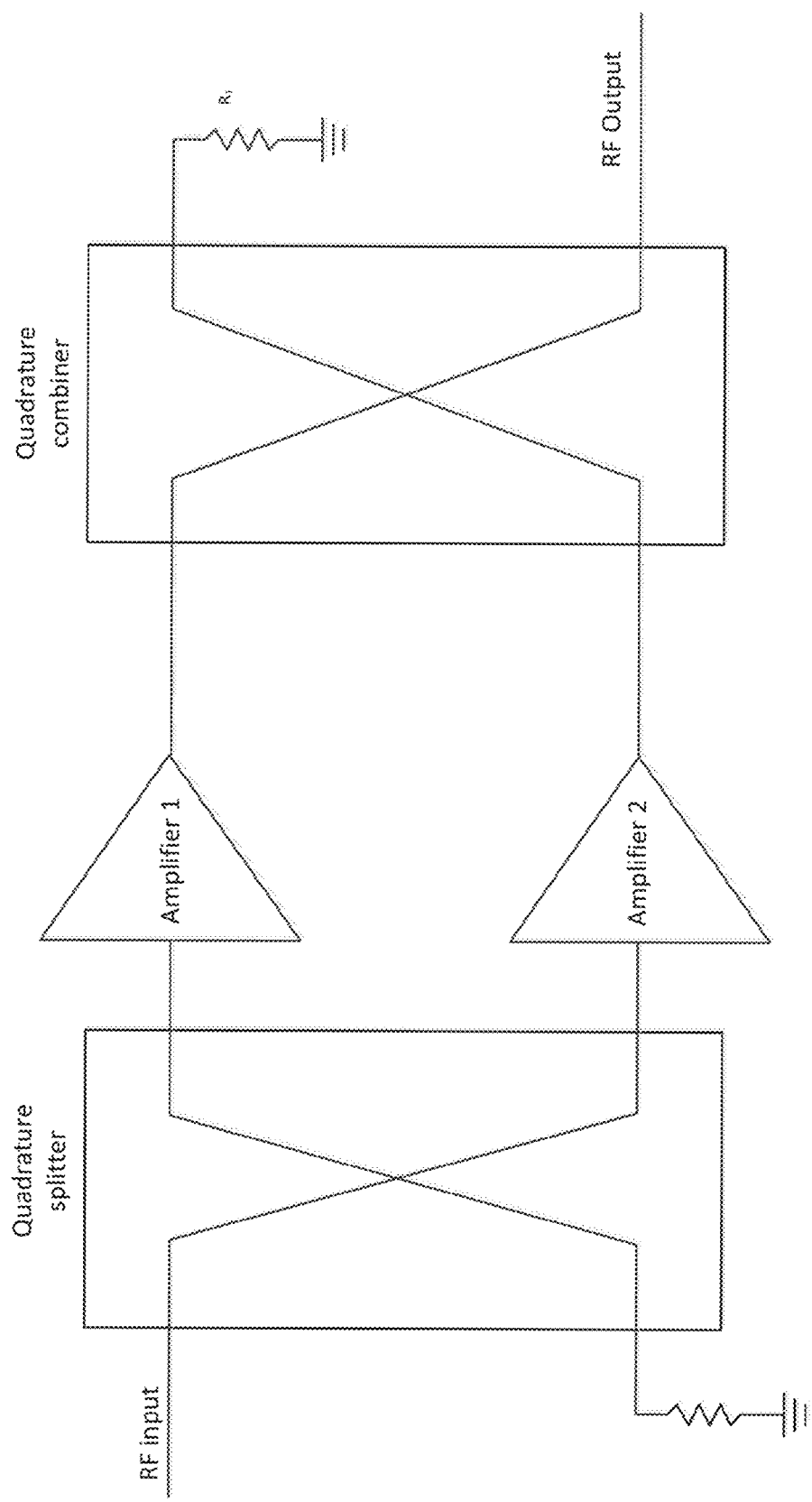
FIG. 8 is a diagram depicting an exemplary embodiment of the balanced amplifiers shown in FIG. 7.

FIG. 8 depicts an exemplary balanced amplifier that may be utilized in connection with realizing the balanced amplifiers depicted in FIG. 7.

Figure 9:
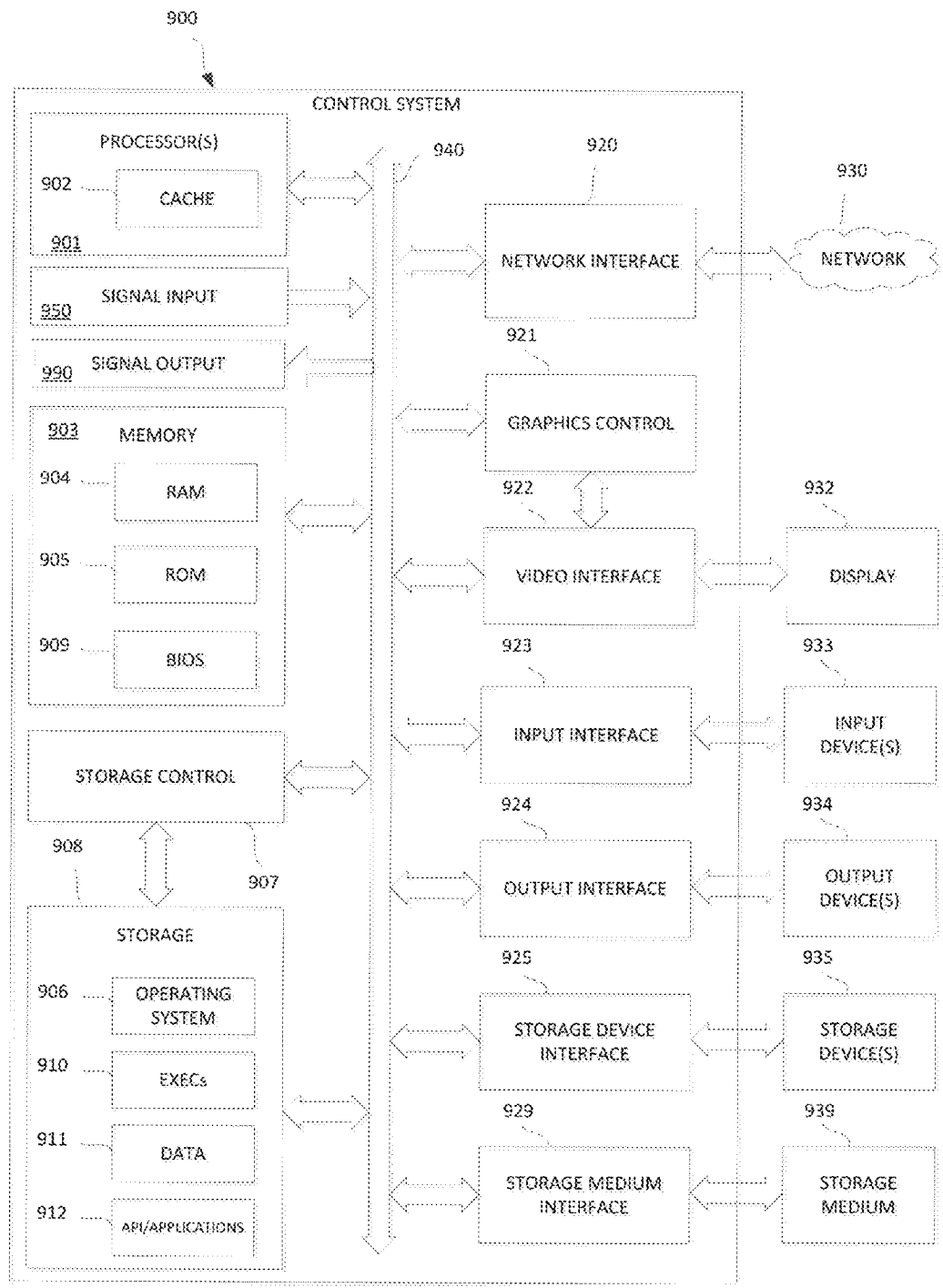
FIG. 9 is a diagram depicting a control system that may be utilized to realize the controller depicted in FIG. 7.

Referring next to FIG. 9, it depicts an exemplary control system 900 that may be utilized to implement the controller 706 and user interfaces described with reference to FIG. 7. But the components in FIG. 9 are examples only and do not limit the scope of use or functionality of any hardware, software, firmware, embedded logic component, or a combination of two or more such components implementing particular embodiments of this disclosure.

Control system 900 in this embodiment includes at least a processor 901 such as a central processing unit (CPU) or an FPGA to name two non-limiting examples. The control system 900 may also comprise a memory 903 and storage 908, both communicating with each other, and with other components, via a bus 940. The bus 940 may also link a display 932, one or more input devices 933 (which may, for example, include a keypad, a keyboard, a mouse, a stylus, etc.), one or more output devices 934, one or more storage devices 935, and various non-transitory, tangible processor-readable storage media 936 with each other and with one or more of the processor 901, the memory 903, and the storage 908. All of these elements may interface directly or via one or more interfaces or adaptors to the bus 940. For instance, the various non-transitory, tangible processor-readable storage media 936 can interface with the bus 940 via storage medium interface 926. Control system 900 may have any suitable physical form, including but not limited to one or more integrated circuits (ICs), printed circuit boards (PCBs), mobile handheld devices, laptop or notebook computers, distributed computer systems, computing grids, or servers.

Processor(s) 901 (or central processing unit(s) (CPU(s))) optionally contains a cache memory unit 902 for temporary local storage of instructions, data, or processor addresses. Processor(s) 901 are configured to assist in execution of non-transitory processor-readable instructions stored on at least one non-transitory, tangible processor-readable storage medium. Control system 900 may provide functionality as a result of the processor(s) 901 executing instructions embodied in one or more non-transitory, tangible processor-readable storage media, such as memory 903, storage 908, storage devices 935, and/or storage medium 936 (e.g., read only memory (ROM)). For instance, instructions to effectuate one or more steps of the method described with reference to FIG. 5 may be embodied in one or more non-transitory, tangible processor-readable storage media and processor(s) 901 may execute the instructions. Memory 903 may read the instructions from one or more other non-transitory, tangible processor-readable storage media (such as mass storage device(s) 935, 936) or from one or more other sources through a suitable interface, such as network interface 920. Carrying out such processes or steps may include defining data structures stored in memory 903 and modifying the data structures as directed by the software.

The signal input component 950 generally operates to receive signals (e.g., digital and/or analog signals) that provide information about one or more aspects of the RF power output 718. For example, the RF sensor 716 may include voltage and/or current sensors (e.g., VI sensors, directional couplers, simple voltage sensors, or current transducers) that provide analog voltage signals, which are received and converted to digital signals by the signal input component 950.

The signal output component 960 may include digital-to-analog components known to those of ordinary skill in the art to generate the frequency control signal 710 to control the frequency of the signal generated by the signal generator 712, which may be implemented by any of a variety of signal generators known to those of skill in the art. For example, the frequency control signal 710 may be a voltage that is varied to effectuate (via the signal generator 712) the frequency changes that are made to tune the generator as described with reference to FIG. 5.

The memory 903 may include various components (e.g., non-transitory, tangible processor-readable storage media) including, but not limited to, a random access memory component (e.g., RAM 904) (e.g., a static RAM "SRAM", a dynamic RAM "DRAM, etc.), a read-only component (e.g., ROM 905), and any combinations thereof. ROM 905 may act to communicate data and instructions unidirectionally to processor(s) 901, and RAM 904 may act to communicate data and instructions bidirectionally with processor(s) 901. ROM 905 and RAM 904 may include any suitable non-transitory, tangible processor-readable storage media described below. In some instances, ROM 905 and RAM 904 include non-transitory, tangible processor-readable storage media for carrying out the methods described herein.

Fixed storage 908 is connected bidirectionally to processor(s) 901, optionally through storage control unit 907. Fixed storage 908 provides additional data storage capacity and may also include any suitable non-transitory, tangible processor-readable media described herein. Storage 908 may be used to store operating system 009, EXECs 910 (executables), data 911, API applications 912 (application programs), and the like. Often, although not always, storage 908 is a secondary storage medium (such as a hard disk) that is slower than primary storage (e.g., memory 903). Storage 908 can also include an optical disk drive, a solid-state memory device (e.g., flash-based systems), or a combination of any of the above. Information in storage 908 may, in appropriate cases, be incorporated as virtual memory in memory 903.

In one example, storage device(s) 935 may be removably interfaced with control system 900 (e.g., via an external port connector (not shown)) via a storage device interface 925. Particularly, storage device(s) 935 and an associated machine-readable medium may provide nonvolatile and/or volatile storage of machine-readable instructions, data structures, program modules, and/or other data for the control system 900. In one example, software may reside, completely or partially, within a machine-readable medium on storage device(s) 935. In another example, software may reside, completely or partially, within processor(s) 901.

Bus 940 connects a wide variety of subsystems. Herein, reference to a bus may encompass one or more digital signal lines serving a common function, where appropriate. Bus 940 may be any of several types of bus structures including, but not limited to, a memory bus, a memory controller, a peripheral bus, a local bus, and any combinations thereof, using any of a variety of bus architectures. As an example and not by way of limitation, such architectures include an Industry Standard Architecture (ISA) bus, an Enhanced ISA (EISA) bus, a Micro Channel Architecture (MCA) bus, a Video Electronics Standards Association local bus (VLB), a Peripheral Component Interconnect (PCI) bus, a PCI-Express (PCI-X) bus, an Accelerated Graphics Port (AGP) bus, HyperTransport (HTX) bus, serial advanced technology attachment (SATA) bus, and any combinations thereof.

Control system 900 may also include an input device 933. In one example, a user of control system 900 may enter commands and/or other information into control system 900 via input device(s) 933. Examples of an input device(s) 933 include, but are not limited to, a touch screen, an alpha-numeric input device (e.g., a keyboard), a pointing device (e.g., a mouse or touchpad), a touchpad, a joystick, a gamepad, an audio input device (e.g., a microphone, a voice response system, etc.), an optical scanner, a video or still image capture device (e.g., a camera), and any combinations thereof. Input device(s) 933 may be interfaced to bus 940 via any of a variety of input interfaces 923 (e.g., input interface 923) including, but not limited to, serial, parallel, game port, USB, FIREWIRE, THUNDERBOLT, or any combination of the above.

Information and data can be displayed through a display 932. Examples of a display 932 include, but are not limited to, a liquid crystal display (LCD), an organic liquid crystal display (OLED), a cathode ray tube (CRT), a plasma display, and any combinations thereof. The display 932 can interface to the processor(s) 901, memory 903, and fixed storage 908, as well as other devices, such as input device(s) 933, via the bus 940. The display 932 is linked to the bus 940 via a video interface 922, and transport of data between the display 932 and the bus 940 can be controlled via the graphics control 921.

In addition or as an alternative, control system 900 may provide functionality as a result of logic hardwired or otherwise embodied in a circuit, which may operate in place of or together with software to execute one or more steps of the method described with reference to FIG. 5. Moreover, reference to a non-transitory, tangible processor-readable medium may encompass a circuit (such as an IC) storing instructions for execution, a circuit embodying logic for execution, or both, where appropriate. The present disclosure encompasses any suitable combination of hardware in connection with software.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A generator comprising:
    a controllable signal generator to generate a frequency in response to a frequency control signal;
    a power amplifier to generate power at the generated frequency, wherein the power amplifier has a source impedance matched to an impedance presented to the power amplifier;
    an output line coupled to the power amplifier;
    a sensor coupled to the power amplifier, the sensor generates an output signal indicative of an impedance presented to the power amplifier;
    a controller that is coupled to the sensor and the controllable signal generator, the controller provides the frequency control signal to the controllable signal generator in response to the output signal indicative of the impedance presented to the power amplifier, the controller including a processor and a non-transitory, tangible processor readable storage medium encoded with processor readable instructions for adjusting the frequency control signal, the instructions including instructions for:
        setting the frequency control signal to a current best level so the controllable signal generator generates a current best frequency;
        determining a current best error based upon the output signal from the sensor;
        maintaining the frequency control signal at the current best level for a main-time-period;
        changing the frequency control signal to a probe level so the signal generator generates a probe frequency;
        maintaining the frequency control signal at the probe level so the signal generator maintains the probe frequency for a probe-time-period, wherein the probe-time-period is less than the main-time-period; and
        setting the current best frequency to the probe frequency, without changing the frequency from the probe frequency, if the error at the probe frequency is less than the error at the current best frequency.

2. The generator of claim 1, wherein the error is a measure of how close the impedance presented to the generator is a desired impedance.

3. The generator of claim 2, wherein the error is a load reflection coefficient magnitude.

4. The generator of claim 3, wherein the load reflection coefficient magnitude is calculated with respect to an impedance of 50Ω.

5. The generator of claim 1, wherein the probe-time-period is less than 100 microseconds.

6. The generator of claim 1, wherein the probe-time-period is less than ten percent of the main-time-period.

7. The generator of claim 1, wherein the power amplifier includes a balanced amplifier.

8. A generator comprising:
    a controllable signal generator to generate a frequency in response to a frequency control signal;
    a power amplifier to generate power at the generated frequency, wherein the power amplifier includes a balanced amplifier that has a source impedance matched to an impedance presented to the power amplifier;
    an output line coupled to the power amplifier;
    a sensor coupled to the power amplifier, the sensor generates an output signal indicative of the impedance presented to the power amplifier;
    control means, coupled to the sensor and the controllable signal generator, for providing the frequency control signal to the controllable signal generator in response to the output signal indicative of the impedance presented to the power amplifier, the control means including:
    means for setting the frequency control signal to a current best level so the controllable signal generator generates a current best frequency;
    means for determining a current best error based upon the output signal from the sensor;
    means for maintaining the frequency control signal at the current best level for a main-time-period;
    means for changing the frequency control signal to a probe level so the signal generator generates a probe frequency;
    means for maintaining the frequency control signal at the probe level so the signal generator maintains the probe frequency for a probe-time-period, wherein the probe-time-period is less than the main-time-period; and
    means for setting the current best frequency to the probe frequency, without changing the frequency from the probe frequency, if the error at the probe frequency is less than the error at the current best frequency.

9. The generator of claim 8, wherein the error is a measure of how close the impedance presented to the generator is a desired impedance.

10. The generator of claim 9, wherein the error is a load reflection coefficient magnitude.

11. The generator of claim 10, wherein the load reflection coefficient magnitude is calculated with respect to an impedance of 50Ω.

12. The generator of claim 9, wherein the probe-time-period is less than 100 microseconds.

13. A generator comprising:
    a power amplifier that provides the generator a source impedance matched to an impedance presented to the power amplifier;
    means for coupling the generator to a plasma chamber;
    means for igniting a plasma in the plasma chamber;
    an impedance
    a controller configured to change a frequency of the power applied to the plasma chamber from a current best frequency to a probe frequency, after a single probe at the probe frequency, if an error at the probe frequency is less than an error at the current best frequency.

14. The generator of claim 13, wherein the controller is configured to calculate the error as a measure of how close the impedance presented to the generator is to the source impedance of the generator.

15. The generator of claim 14, wherein the error is a load reflection coefficient magnitude.

16. The generator of claim 15, wherein the load reflection coefficient magnitude is calculated with respect to an impedance of 50Ω.

17. The generator of claim 14 including a sensor coupled to the power amplifier, the sensor generates an output signal indicative of the impedance presented to the power amplifier, and the controller is configured to calculate the error.

* * * * *